US011956944B2

(12) United States Patent
Chen et al.

(10) Patent No.: US 11,956,944 B2
(45) Date of Patent: Apr. 9, 2024

(54) DRAM SEMICONDUCTOR STRUCTURE FORMATION METHOD AND DRAM SEMICONDUCTOR STRUCTURE

(71) Applicant: CHANGXIN MEMORY TECHNOLOGIES, INC., Hefei (CN)

(72) Inventors: Longyang Chen, Hefei (CN); Hongfa Wu, Hefei (CN); Gongyi Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 288 days.

(21) Appl. No.: 17/455,986

(22) Filed: Nov. 22, 2021

(65) Prior Publication Data

US 2022/0130833 A1   Apr. 28, 2022

Related U.S. Application Data

(63) Continuation of application No. PCT/CN2021/108403, filed on Jul. 26, 2021.

(30) Foreign Application Priority Data

Oct. 28, 2020 (CN) .......................... 202011173598.6

(51) Int. Cl.
   *H10B 12/00* (2023.01)
(52) U.S. Cl.
   CPC ....... *H10B 12/315* (2023.02); *H10B 12/0335* (2023.02); *H10B 12/34* (2023.02)
(58) Field of Classification Search
   CPC ..................... H10B 12/0335; H10B 12/315
   See application file for complete search history.

(56) References Cited

U.S. PATENT DOCUMENTS 5,648,291 A   7/1997 Sung
6,384,464 B1   5/2002 Shin
(Continued)

FOREIGN PATENT DOCUMENTS

CN   1178393 A   4/1998
CN   101933134 A   12/2010
(Continued)

OTHER PUBLICATIONS

International Search Report as cited in PCT Application No. PCT/CN2021/108403 dated Oct. 13, 2021, 4 pages.
(Continued)

*Primary Examiner* — Robert G Bachner
*Assistant Examiner* — Molly K Reida
(74) *Attorney, Agent, or Firm* — Cooper Legal Group, LLC

(57) ABSTRACT

Embodiments of the present application provide a semiconductor structure formation method and a semiconductor structure. The method includes: the substrate including contact region and dummy region, a first bitline structure and a first dielectric layer being formed on the substrate, the first bitline structure and the first dielectric layer defining discrete capacitor contact openings; forming a first sacrificial layer filling the capacitor contact opening; removing, in the dummy region, part of height of the first bitline structure, part of height of the first dielectric layer and part of height of the first sacrificial layer to form a first opening located at top of a second bitline structure, a second dielectric layer and a second sacrificial layer; forming an insulation layer filling the first opening; removing, in the contact region, the first sacrificial layer to form a second opening; and forming a capacitor contact structure located in the second opening.

17 Claims, 13 Drawing Sheets

(56) References Cited

U.S. PATENT DOCUMENTS

| | | |
|---|---|---|
| 8,023,352 B2 | 9/2011 | Masuoka |
| 8,218,387 B2 | 7/2012 | Masuoka |
| 8,248,876 B2 | 8/2012 | Masuoka |
| 9,343,320 B2 | 5/2016 | Cheng |
| 10,446,556 B2 | 10/2019 | Liao |
| 10,453,848 B2 | 10/2019 | Lin |
| 10,741,561 B2 | 8/2020 | Lin |
| 2010/0142257 A1 | 6/2010 | Masuoka |
| 2011/0298029 A1 | 12/2011 | Masuoka |
| 2011/0298030 A1 | 12/2011 | Masuoka |
| 2015/0162337 A1 | 6/2015 | Cheng et al. |
| 2018/0122809 A1 | 5/2018 | Lin |
| 2019/0198504 A1 | 6/2019 | Liao |
| 2019/0198505 A1 | 6/2019 | Liao |
| 2020/0006347 A1 | 1/2020 | Lin |

FOREIGN PATENT DOCUMENTS

| | | |
|---|---|---|
| CN | 106158751 A | 11/2016 |
| CN | 108010883 A | 5/2018 |
| CN | 111640748 A | 9/2020 |
| CN | 111834301 A | 10/2020 |

OTHER PUBLICATIONS

International Search Report in the corresponding international application No. PCT/CN2021/106070, dated Oct. 12, 2021.

US 11,956,944 B2

DRAM SEMICONDUCTOR STRUCTURE FORMATION METHOD AND DRAM SEMICONDUCTOR STRUCTURE

CROSS-REFERENCE TO RELATED APPLICATIONS

This application is a continuation application of International Patent Application No. PCT/CN2021/108403, filed on Jul. 26, 2021, which claims priority to Chinese Patent Application No. 202011173598.6, filed with the Chinese Patent Office on Oct. 28, 2020 and entitled "SEMICONDUCTOR STRUCTURE FORMATION METHOD AND SEMICONDUCTOR STRUCTURE." International Patent Application No. PCT/CN2021/108403 and Chinese Patent Application No. 202011173598.6 are incorporated herein by reference in their entireties.

TECHNICAL FIELD

The present application relates to the field of semiconductors.

BACKGROUND

The development of a Dynamic Random Access Memory (DRAM) is characterized by a high speed, high integration density and low power consumption.

With the miniaturization of a semiconductor structure in size, especially during the manufacturing of the DRAM with a critical dimension less than 20 nm, an etch load effect of an array region and a peripheral region of the DRAM becomes greater and greater. In order to ensure the integrity and effectiveness of a circuit structure in the array region of the DRAM, a dummy structure is generally required to be designed in the array region.

During the manufacturing of the DRAM, a dummy capacitor contact structure and a dummy bitline structure are the most common dummy structures. However, the applicant finds that, due to a requirement of a manufacturing process, a wet cleaning process is needed multiple times in the manufacturing process of a capacitor contact structure, which leads to damages to part of the dummy capacitor contact structure, thereby forming a deep void. With the miniaturization of the critical dimension, conductors of a capacitor contact pad are more and more densely arranged. During the formation of the conductors of the capacitor contact pad, the void is easy to be filled with metal materials, resulting in short circuit of the conductors of the capacitor contact pad.

SUMMARY

Embodiments of the present application can/at least prevent a problem of short circuit of conductors of a capacitor contact pad with the miniaturization of a critical dimension.

According to some embodiments, in a first aspect, the present application provides a semiconductor structure formation method, including: providing a substrate, the substrate including a contact region and a dummy region arranged adjacent to each other, a first bitline structure and a first dielectric layer arranged discretely being formed on the substrate, an extension direction of the first dielectric layer intersecting with that of the first bitline structure, and the first bitline structure and the first dielectric layer defining discrete capacitor contact openings; forming a first sacrificial layer filling the capacitor contact opening; removing, in the dummy region, part of height of the first bitline structure, part of height of the first dielectric layer and part of height of the first sacrificial layer to form a first opening located at top of a second bitline structure, a second dielectric layer and a second sacrificial layer, wherein the remaining first bitline structure forms as the second bitline structure, the remaining first dielectric layer forms as the second dielectric layer, and the remaining first sacrificial layer forms as the second sacrificial layer; forming an insulation layer filling the first opening; removing, in the contact region, the first sacrificial layer to form a second opening; and forming a capacitor contact structure located in the second opening.

According to some embodiments, in a second aspect, the present application provides a semiconductor structure, including: a substrate including a contact region and a dummy region arranged adjacent to each other; a bitline structure and a dielectric layer, an extension direction of the dielectric layer intersecting with that of the bitline structure, and the bitline structure and the dielectric layer defining discrete capacitor contact openings, wherein the bitline structure includes a first bitline structure and a second bitline structure, the dielectric layer includes a first dielectric layer and a second dielectric layer, the second bitline structure and the second dielectric layer are located in the dummy region, the first bitline structure and the first dielectric layer are located in the contact region, a height of the second bitline structure is less than that of the first bitline structure, and a height of the second dielectric layer is less than that of the first dielectric layer; a second sacrificial layer filling the capacitor contact opening in the dummy region; an insulation layer located on top surfaces of the second bitline structure, the second dielectric layer and the second sacrificial layer located in the dummy region, a top surface of the insulation layer being flush with a top surface of the first bitline structure; and a capacitor contact structure filling the capacitor contact opening in the contact region.

BRIEF DESCRIPTION OF DRAWINGS

In order to more clearly illustrate the technical solutions in the embodiments of the present application or the conventional art, the accompanying drawings used in the description of the embodiments will be briefly introduced below. It is apparent that, the accompanying drawings in the following description are only some embodiments of the present application, and other drawings can be obtained by those of ordinary skill in the art from the provided drawings without creative efforts.

DESCRIPTION OF EMBODIMENTS

Figure 1:
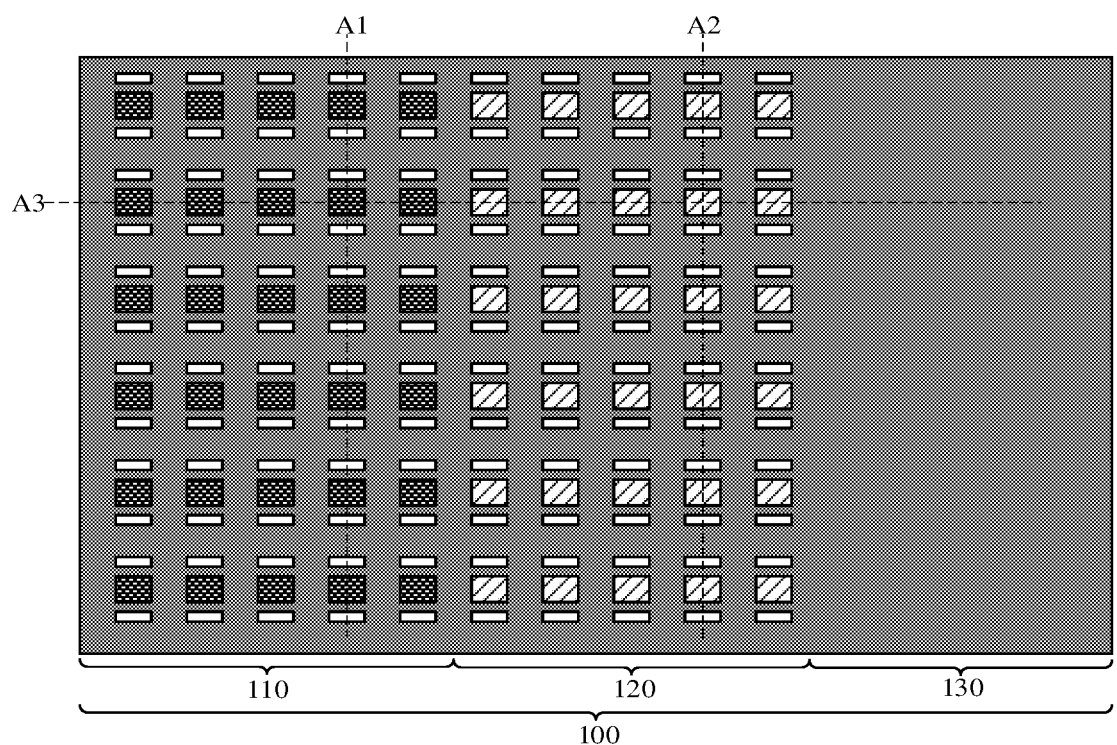
FIG. 1 is a schematic top view of a semiconductor structure according to a first embodiment of the present application.

Currently, due to a requirement of a manufacturing process, a wet cleaning process is needed multiple times in the manufacturing process of a capacitor contact structure. The wet cleaning process has an etch load effect, and an etch rate may decrease correspondingly for a densely etched region, which leads to the over-etching of other structures during the formation of a capacitor contact opening, for example, the over-etching of a dummy capacitor contact structure, resulting in a deep void in the dummy capacitor contact structure. The void is filled with some metal materials during subsequent formation of conductors of a capacitor contact pad. With the miniaturization of a critical dimension, the conductors of the capacitor contact pad are arranged more and more densely, and some metal materials of adjacent conductors of the capacitor contact pad may fill a same void, resulting in short circuit of the conductors of the capacitor contact pad formed.

A first embodiment of the present application provides a semiconductor structure formation method, including: providing a substrate, the substrate including a contact region and a dummy region arranged adjacent to each other, a first bitline structure and a first dielectric layer arranged discretely being formed on the substrate, an extension direction of the first dielectric layer intersecting with that of the first bitline structure, and the first bitline structure and the first dielectric layer defining discrete capacitor contact openings; forming a first sacrificial layer filling the capacitor contact opening; removing, in the dummy region, part of height of the first bitline structure, part of height of the first dielectric layer and part of height of the first sacrificial layer to form a first opening located at top of a second bitline structure, a second dielectric layer and a second sacrificial layer, wherein the remaining first bitline structure forms as the second bitline structure, the remaining first dielectric layer forms as the second dielectric layer, and the remaining first sacrificial layer forms as the second sacrificial layer; forming an insulation layer filling the first opening; removing, in the contact region, the first sacrificial layer to form a second opening; and forming a capacitor contact structure located in the second opening.

In order to make the objectives, technical solutions and advantages of the embodiments of the present application clearer, various embodiments of the present application will be described below in details with reference to the drawings. However, those of ordinary skill in the art may understand that, in the embodiments of the present application, numerous technical details are set forth in order to enable a reader to better understand the present application. However, the technical solutions claimed in the present application can be implemented without these technical details and various changes and modifications based on the embodiments below. The embodiments below are divided for the convenience of description, and should not constitute any limitation on specific implementation manners of the present application. The embodiments may be combined with each other and mutually referred to without contradiction.

FIG. 1 is a schematic top view of a semiconductor structure according to a first embodiment of the present application; FIG. 2, FIG. 5, FIG. 7, FIG. 10, FIG. 13, FIG. 16, FIG. 18, FIG. 21 and FIG. 24 are schematic sectional views corresponding to steps along a direction A1 in a semiconductor structure formation method according to the first embodiment of the present application; FIG. 3, FIG. 8, FIG. 11, FIG. 14, FIG. 19 and FIG. 22 are schematic sectional views corresponding to steps along a direction A2 in the semiconductor structure formation method according to the first embodiment of the present application; and FIG. 4, FIG. 6, FIG. 9, FIG. 12, FIG. 15, FIG. 17, FIG. 20, FIG. 23 and FIG. 25 are schematic sectional views corresponding to steps along a direction A3 in the semiconductor structure formation method according to the first embodiment of the present application.

Referring to FIG. 1, a substrate 100 is provided. The substrate 100 includes a contact region 110 and a dummy region 120 arranged adjacent to each other.

Specifically, the substrate 100 includes an array region and a peripheral region 130. The array region is divided into the contact region 110 and the dummy region 120. The contact region 110 is configured to form a capacitor contact structure configured to realize an electrical connection between a memory capacitor and a transistor. The dummy region 120 is configured to form a dummy capacitor contact structure configured to ensure integrity and effectiveness of a circuit structure of an array region of a DRAM during the manufacturing of the DRAM with a critical dimension less than 20 nm.

In FIG. 1, the direction A3 is an extension direction of a bitline structure, and the direction A1 and the direction A2 are extension directions of a dielectric layer. This embodiment is specifically introduced with an example in which the bitline structure and the dielectric layer extend perpendicularly to each other. In other embodiments, the extension directions of the bitline structure and the dielectric layer intersect with one another to define capacitor contact openings. The capacitor contact openings defined by the dielectric layer and the bitline structure are shown by larger blocks in FIG. 1. The capacitor contact opening in the contact region 110 and the capacitor contact opening in the dummy region 120 are filled differently only to reflect the capacitor contact openings located in different regions, which does not limit materials and structures of the capacitor contact openings.

In FIG. 1, small boxes located on two sides of the capacitor contact opening are isolation layers on a sidewall of the bitline structure. The sidewall of the bitline structure has a structure of a plurality of isolation layers, so as to reduce parasitic capacitance between the bitline structure and a capacitor contact structure formed by filling the capacitor contact opening. It is to be noted that this embodiment is specifically introduced with an example in which the plurality of isolation layers are provided on the sidewall of the bitline structure. The example in which a plurality of isolation layers are provided on the sidewall of the bitline structure is only a preferred implementation and does not constitute a limitation on this embodiment. In other embodiments, the isolation layer on the sidewall of the bitline structure may be of a monolayer structure.

The semiconductor structure formation method according to this embodiment is specifically introduced below with reference to the schematic diagrams of sectional structures taken along the directions A1, A2 and A3 respectively.

Figure 2:
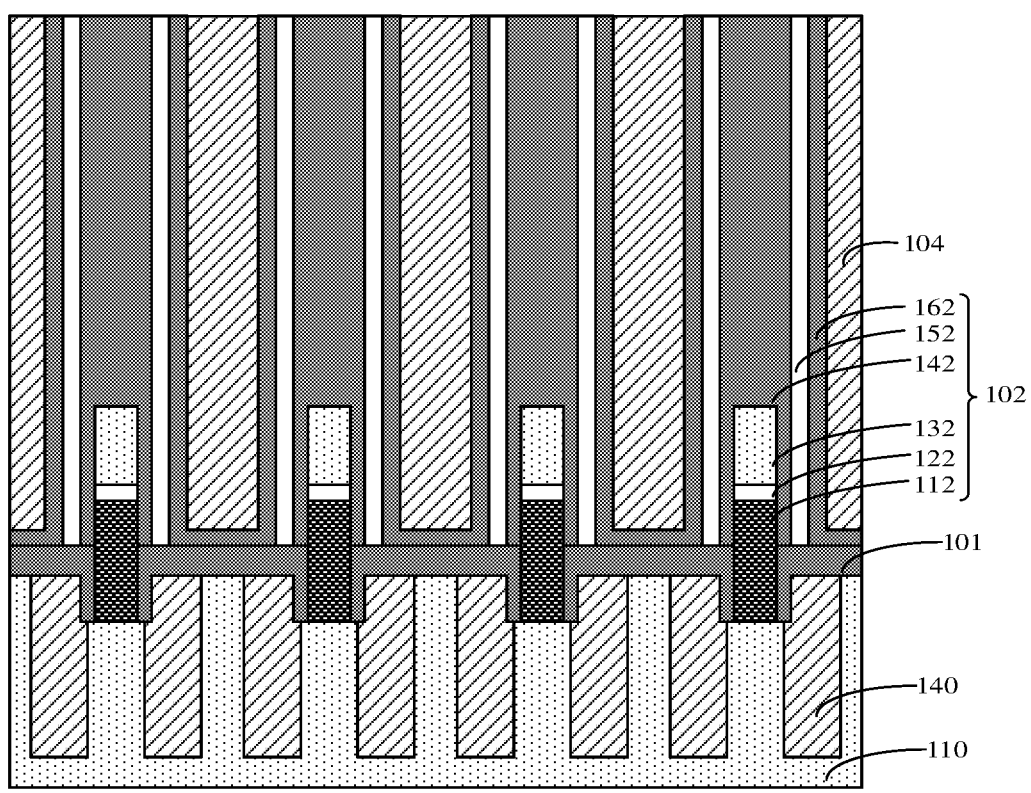
FIG. 2, FIG. 5, FIG. 7, FIG. 10, FIG. 13, FIG. 16, FIG. 18, FIG. 21 and FIG. 24 are schematic sectional views corresponding to steps along a direction A1 in a semiconductor structure formation method according to the first embodiment of the present application.
Figure 3:
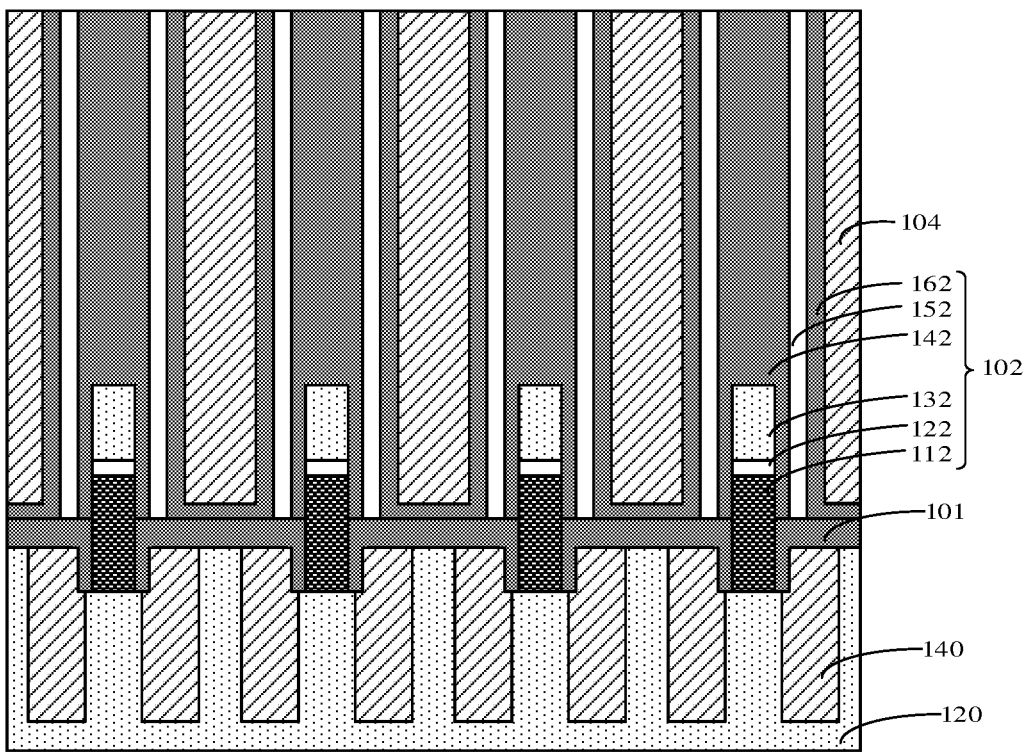
FIG. 3, FIG. 8, FIG. 11, FIG. 14, FIG. 19 and FIG. 22 are schematic sectional views corresponding to steps along a direction A2 in the semiconductor structure formation method according to the first embodiment of the present application.
Figure 4:
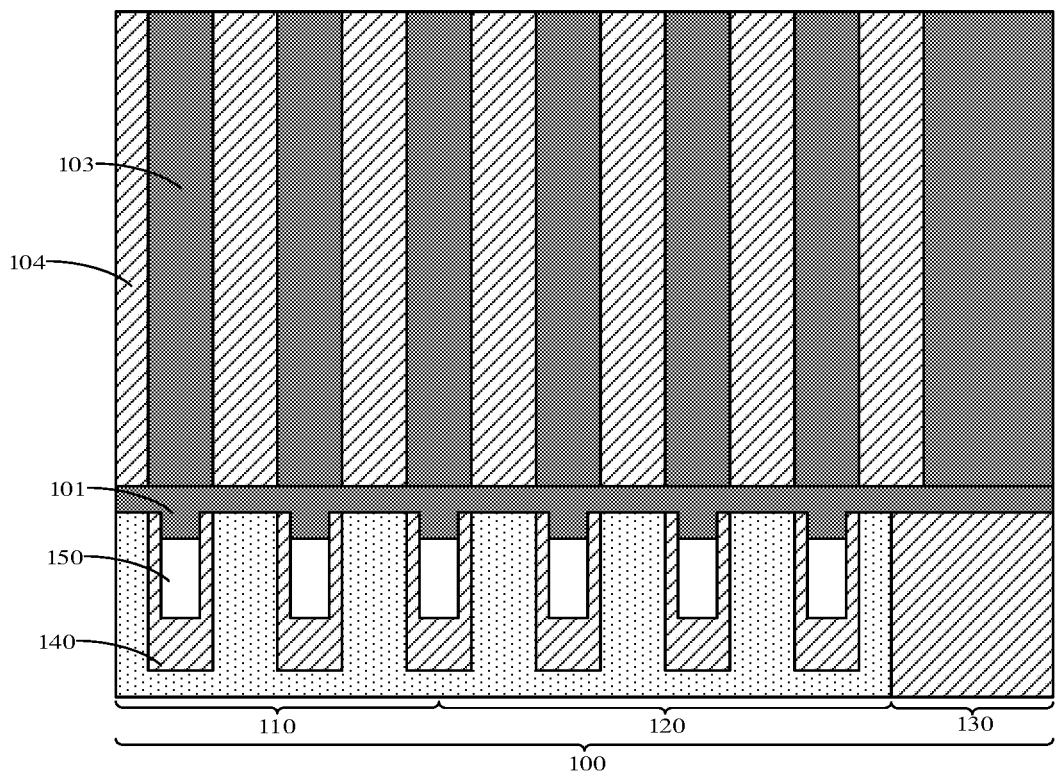
FIG. 4, FIG. 6, FIG. 9, FIG. 12, FIG. 15, FIG. 17, FIG. 20, FIG. 23 and FIG. 25 are schematic sectional views corresponding to steps along a direction A3 in the semiconductor structure formation method according to the first embodiment of the present application.

Referring to FIG. 2 to FIG. 4, a substrate 100 is provided. The substrate 100 includes a contact region 110 and a dummy region 120 arranged adjacent to each other, a first bitline structure 102 and a first dielectric layer 103 arranged discretely are formed on the substrate 100, an extension direction of the first dielectric layer 103 intersects with that of the first bitline structure 102, the first bitline structure 102 and the first dielectric layer 103 define discrete capacitor contact openings (not shown), and a first sacrificial layer 104 filling the capacitor contact opening (not shown) is formed.

Specifically, the substrate 100 includes a shallow trench isolation structure 140 and a wordline structure 150. The shallow trench isolation structure 140 is configured to isolate adjacent active regions (not shown). The wordline structure 150 is of a buried structure, is formed inside the substrate 100, forms as a gate of a transistor, and is configured to connect the first bitline structure 102. It is to be noted that the substrate 100 further includes other semiconductor structures in addition to the shallow trench isolation structure 140 and the wordline structure 150. Since the other semiconductor structures do not involve the core technology of the present application, they are not described in detail herein. Those skilled in the art may understand that the substrate 100 further includes other semiconductor structures in addition to the shallow trench isolation structure 140 and the wordline structure 150, for the normal operation of the semiconductor structure.

The substrate 100 may be made of sapphire, silicon, silicon carbide, gallium arsenide, aluminum nitride, zinc oxide or the like. In this embodiment, the substrate 100 is made of a silicon material. It is clear to those skilled in the art that the substrate 100 being made of the silicon material in this embodiment is intended to facilitate those skilled in the art to understand the subsequent formation method, which does not constitute a limitation. During an actual application, a suitable substrate material may be selected as needed.

The first bitline structure 102 includes a bitline contact layer 112, a conductive contact layer 122, a metal layer 132 and a top dielectric layer 142 sequentially stacked.

The bitline contact layer 112 is made of silicon germanium or polysilicon, and is configured for an electrical connection with the wordline structure 150. The conductive contact layer 122 is made of titanium nitride, and is configured for an electrical connection between the bitline contact layer 112 formed by a semiconductor conductive material and the metal layer 132 formed by a metal conductive material to reduce resistance of an electrical connection path between the first bitline structure 102 and the wordline structure 150. The metal layer 132 may be made of one or more conductive materials, such as doped polysilicon, titanium, titanium nitride, tungsten and a tungsten compound, and is configured for signal transmission of the first bitline structure 102. The top dielectric layer 142 is made of silicon nitride, silicon dioxide, or silicon oxynitride. In this embodiment, the top dielectric layer 142 is made of silicon nitride and is configured to prevent short circuit between the metal layer 132 in the first bitline structure 102 and other conductive structures in the DRAM.

In this embodiment, the top dielectric layer 142 further covers sidewalls of the bitline contact layer 112, the conductive contact layer 122 and the metal layer 132 and forms as a first isolation layer of the first bitline structure 102. A second isolation layer 152 is further formed on a sidewall of the first isolation layer. A third isolation layer 162 is further formed on a sidewall of the second isolation layer 152. In this embodiment, a structure of a plurality of isolation layers is formed on a sidewall of the first bitline structure 102, so as to reduce parasitic capacitance between the first bitline structure 102 and a capacitor contact structure formed by filling the capacitor contact opening.

Specifically, the second isolation layer 152 is made of silicon nitride, silicon dioxide, or silicon oxynitride. In this embodiment, the second isolation layer 152 is made of silicon dioxide. The third isolation layer 162 is made of silicon nitride, silicon dioxide, or silicon oxynitride. In this embodiment, the third isolation layer 162 is made of silicon nitride. In other embodiments, the second isolation layer may also be an air isolation layer. The parasitic capacitance between the first bitline structure 102 and the capacitor contact structure formed by filling the capacitor contact opening can be further reduced by air isolation.

The first dielectric layer 103 is made of an insulation material. Specifically, the first dielectric layer 103 is made of silicon nitride, silicon dioxide, or silicon oxynitride. In this embodiment, the first dielectric layer 103 is made of a same material as the top dielectric layer 142.

In this embodiment, the first sacrificial layer 104 is made of silicon oxide formed by Spin-On Deposition (SOD). The first sacrificial layer 104 formed by SOD has better adhesion and gap filling capability, which ensures that the first sacrificial layer 104 can completely fill the capacitor contact opening defined by the first dielectric layer 103 and the first bitline structure 102.

Specifically, the step of forming a first sacrificial layer 104 filling the capacitor contact opening includes the following steps: forming a first sacrificial film (not shown) filling the capacitor contact opening and covering the first bitline structure 102 and the first dielectric layer 103; and removing the part of the first sacrificial film (not shown) which is higher than a top surface of the first bitline structure 102 to form the first sacrificial layer 104.

Referring to FIG. 5 to FIG. 9, in the dummy region 120, part of height of the first bitline structure 102, part of height of the first dielectric layer 103 and part of height of the first sacrificial layer 104 are removed to form a first opening 401 located at top of a second bitline structure 202, a second dielectric layer 203 and a second sacrificial layer 204. The remaining first bitline structure 102 forms as the second bitline structure 202, the remaining first dielectric layer 103 forms as the second dielectric layer 203, and the remaining first sacrificial layer 104 forms as the second sacrificial layer 204.

Specifically, the step of forming a first opening 401 includes the following steps.

Figure 5:
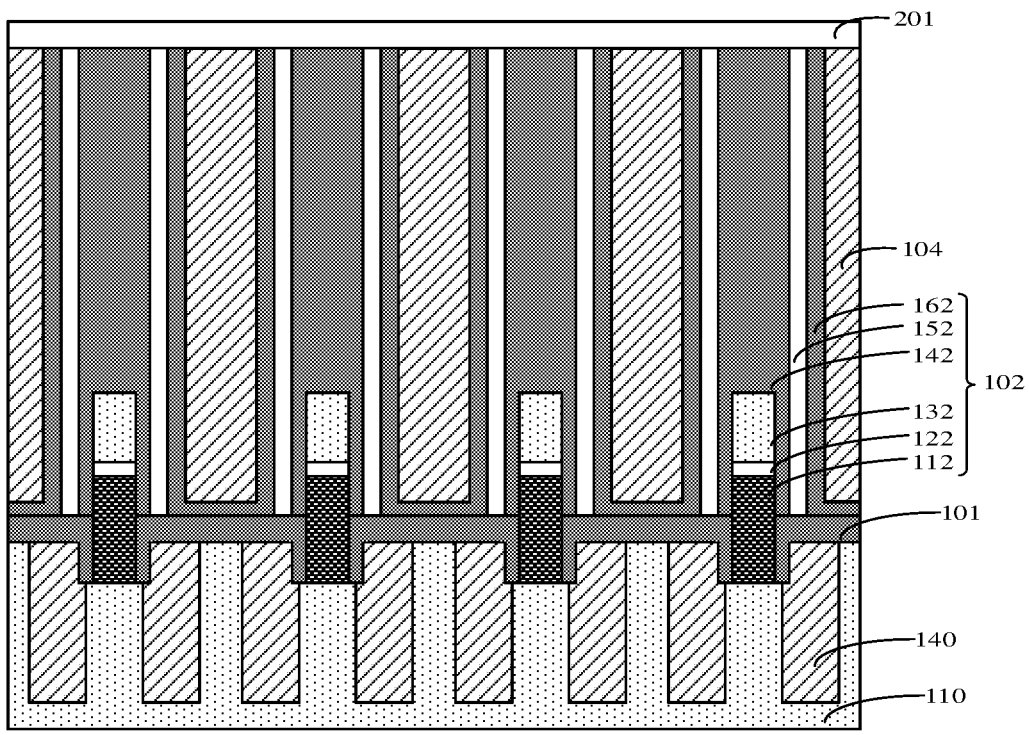
Figure 6:
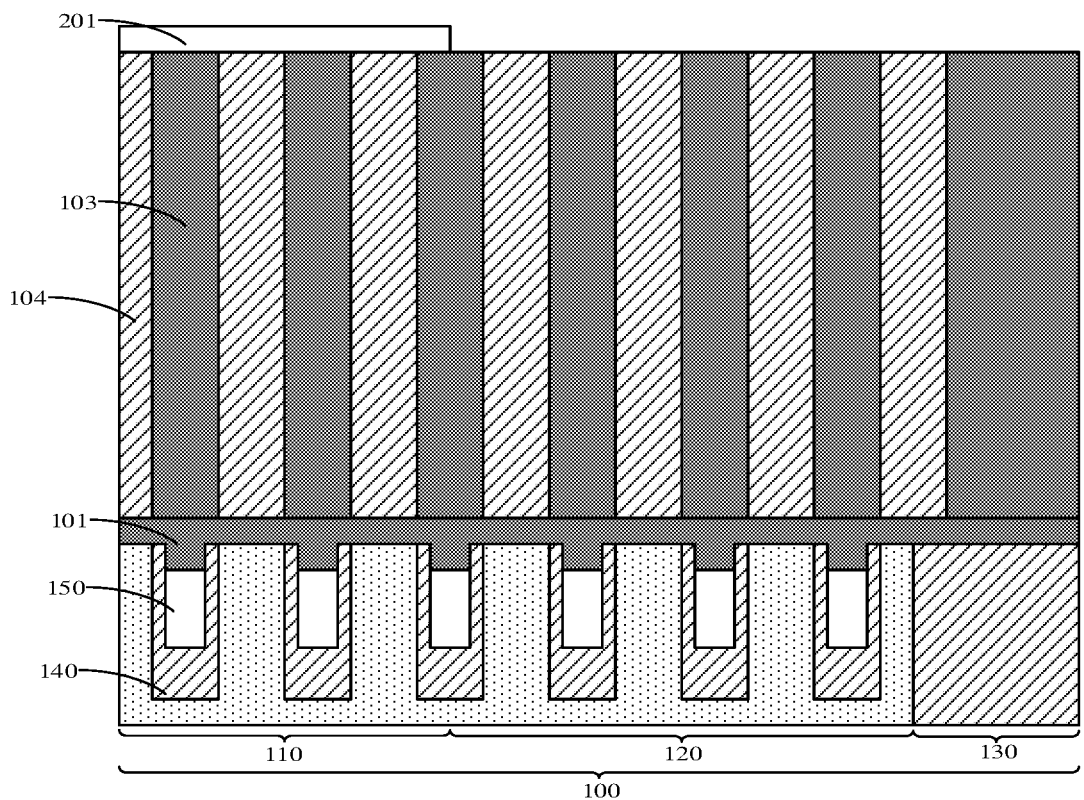

Referring to FIG. 5 and FIG. 6, in the contact region 110, a mask layer 201 located on top surfaces of the first bitline structure 102, the first dielectric layer 103 and the first sacrificial layer 104 is formed.

Specifically, the step of forming a mask layer 210 includes the following steps: forming a mask (not shown) located on top surfaces of the first bitline structure 102, the first dielectric layer 103 and the first sacrificial layer 104 in the contact region 110, the dummy region 120 and the peripheral region 130; forming a photoresist on a top surface of the mask (not shown) in the contact region 110; and patterning the mask (not shown) based on the photoresist to form the mask layer 201.

Figure 7:
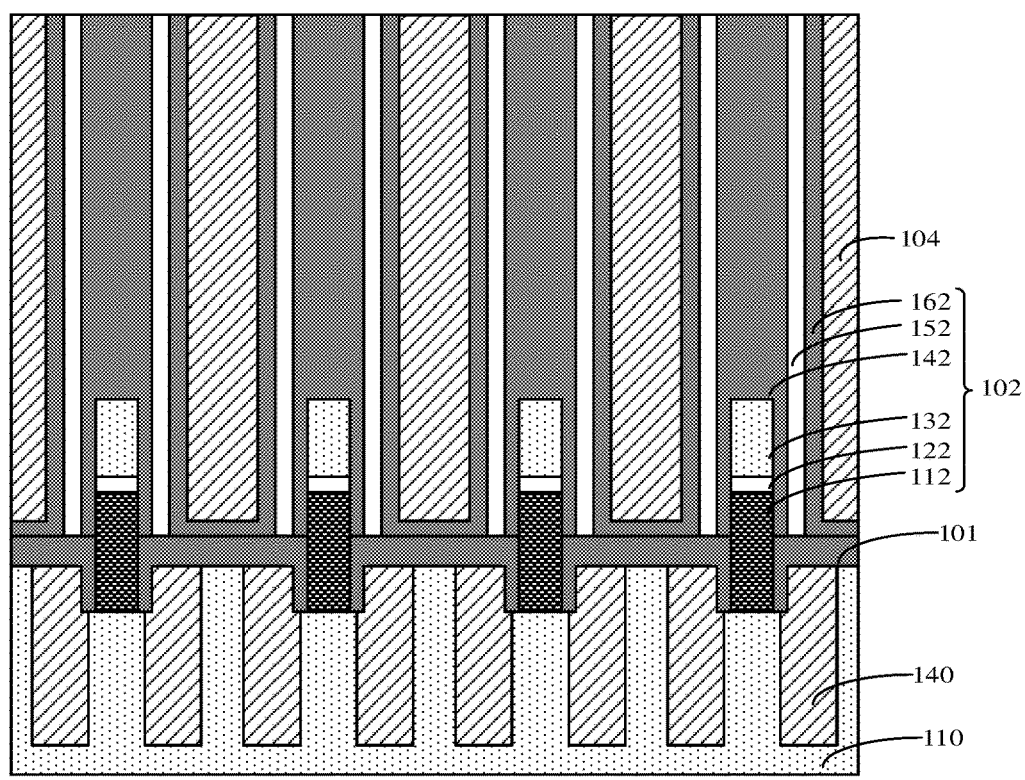
Figure 8:
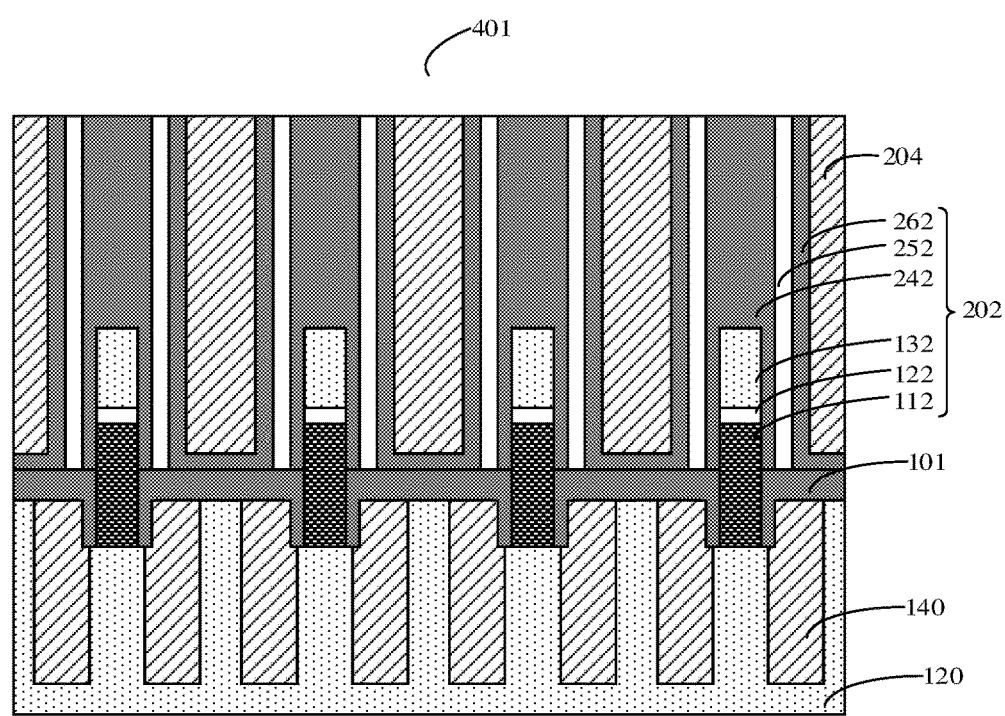
Figure 9:
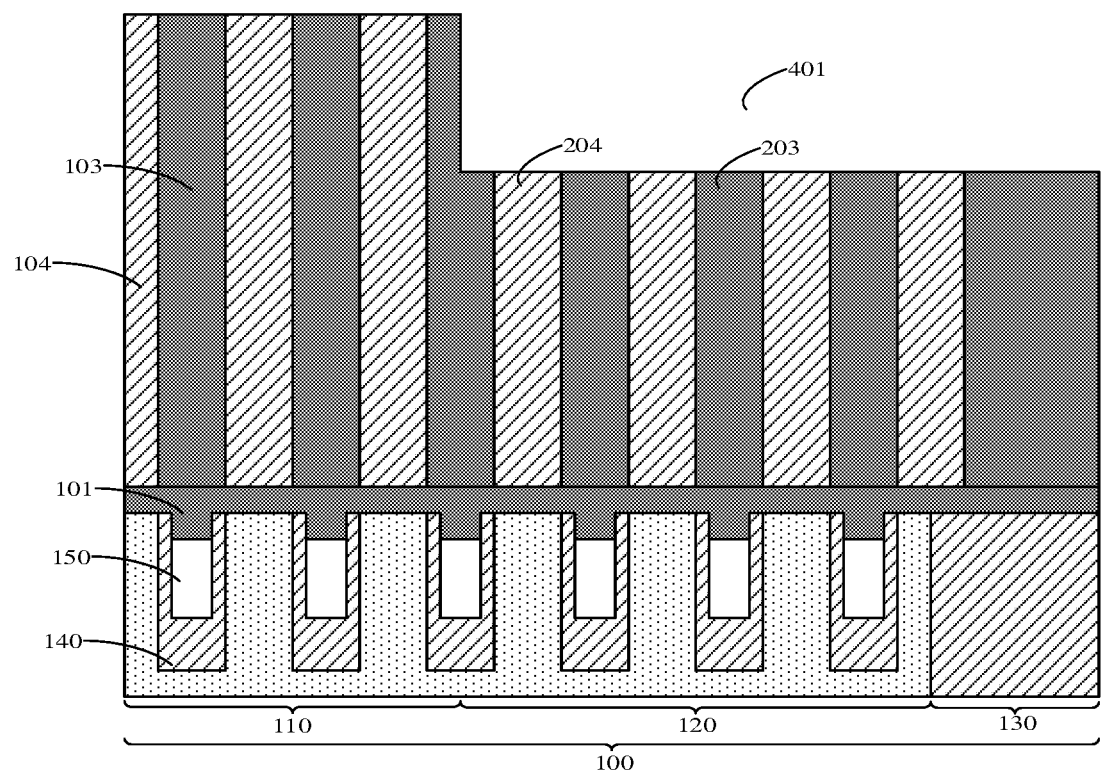

Referring to FIG. 7 to FIG. 9, part of heights of the first bitline structure 102, the first dielectric layer 103 and the first sacrificial layer 104 in the dummy region 120 are etched away based on the mask layer 201 to form the second bitline structure 202, the second dielectric layer 203, the second sacrificial layer 204 and the first opening 401, and the mask layer 201 is removed.

In this embodiment, in a direction perpendicular to the substrate 100, a distance between the metal layer 132 located in the second bitline structure 202 and a bottom surface of the first opening 401 formed is 20 nm to 90 nm. If the distance between the metal layer 132 located in the second bitline structure 202 and the bottom surface of the first opening 401 formed is less than 20 nm, it indicates that in the etched first bitline structure 102, the top dielectric layer 142 is thicker and the remaining top dielectric layer 142 is thinner, so that a distance between the metal layer 132 of the second bitline structure 202 and other conductive structures in the DRAM decreases, and the parasitic capacitance between the metal layer 132 and other conductive structures in the DRAM increases. If the distance between the metal layer 132 located in the second bitline structure 202 and the bottom surface of the first opening 401 formed is greater than 90 nm, it indicates that the top dielectric layer 142 in the etched first bitline structure 102 is thinner, which cannot prevent the problem of short circuit of conductors in a subsequently-formed capacitor contact pad caused by a deep void formed due to damages to part of the dummy capacitor contact structure during the formation of the capacitor contact structure.

Referring to FIG. 10 to FIG. 15, an insulation layer 301 filling the first opening 401 is formed.

Specifically, the step of forming an insulation layer 301 includes the following steps.

Figure 10:
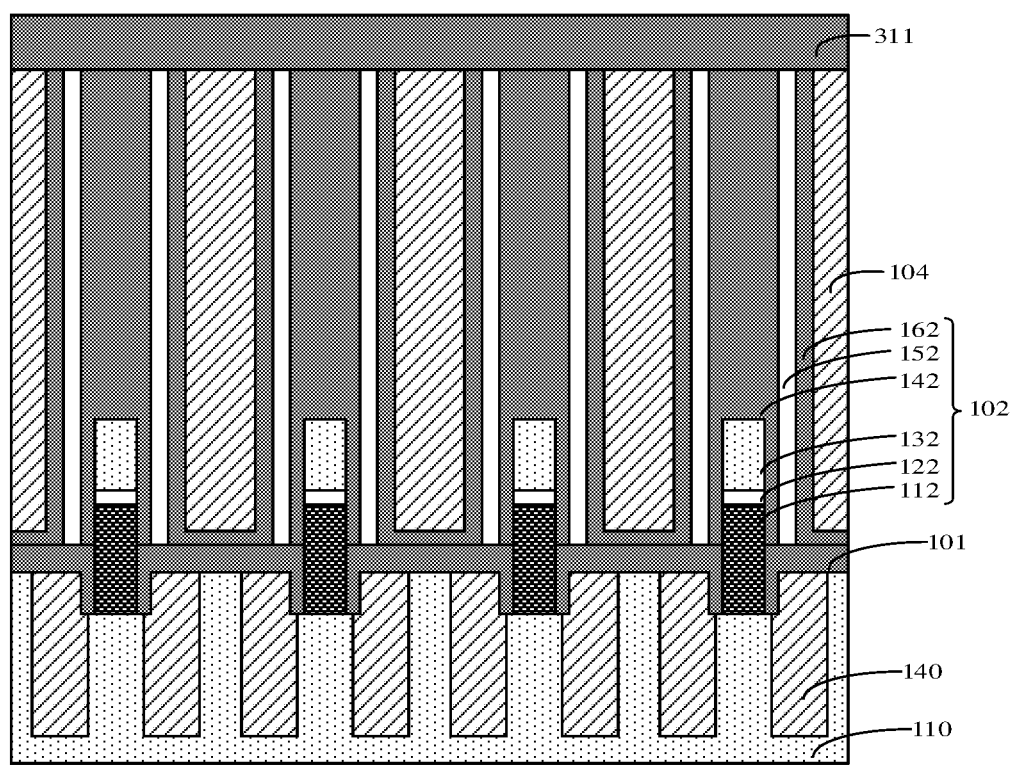
Figure 11:
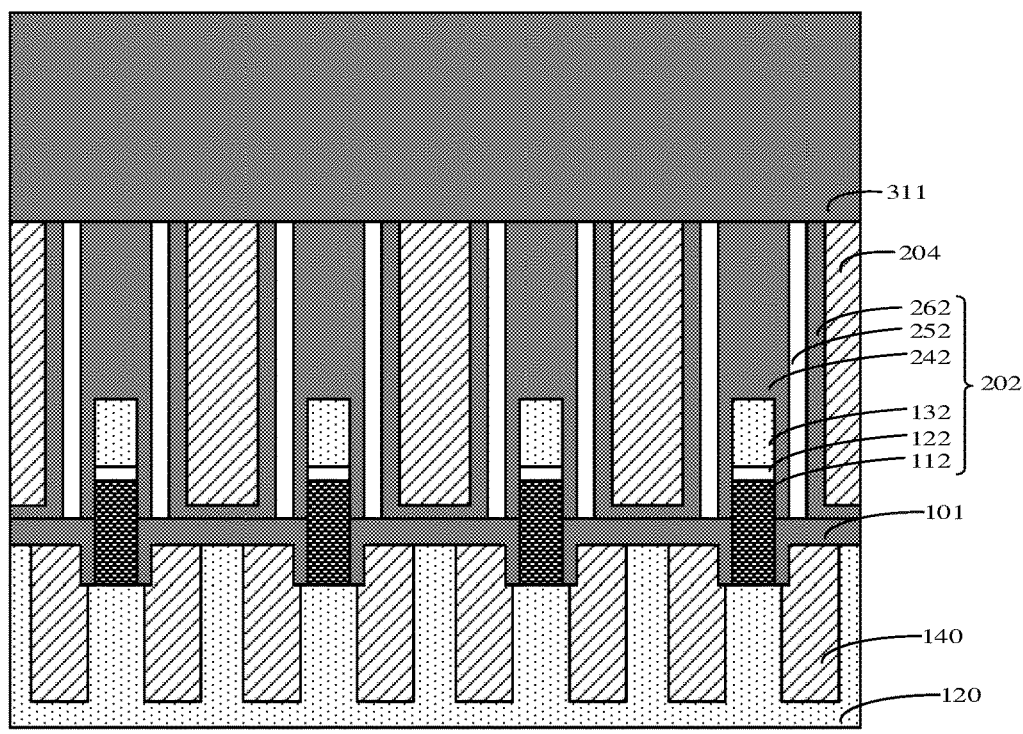
Figure 12:
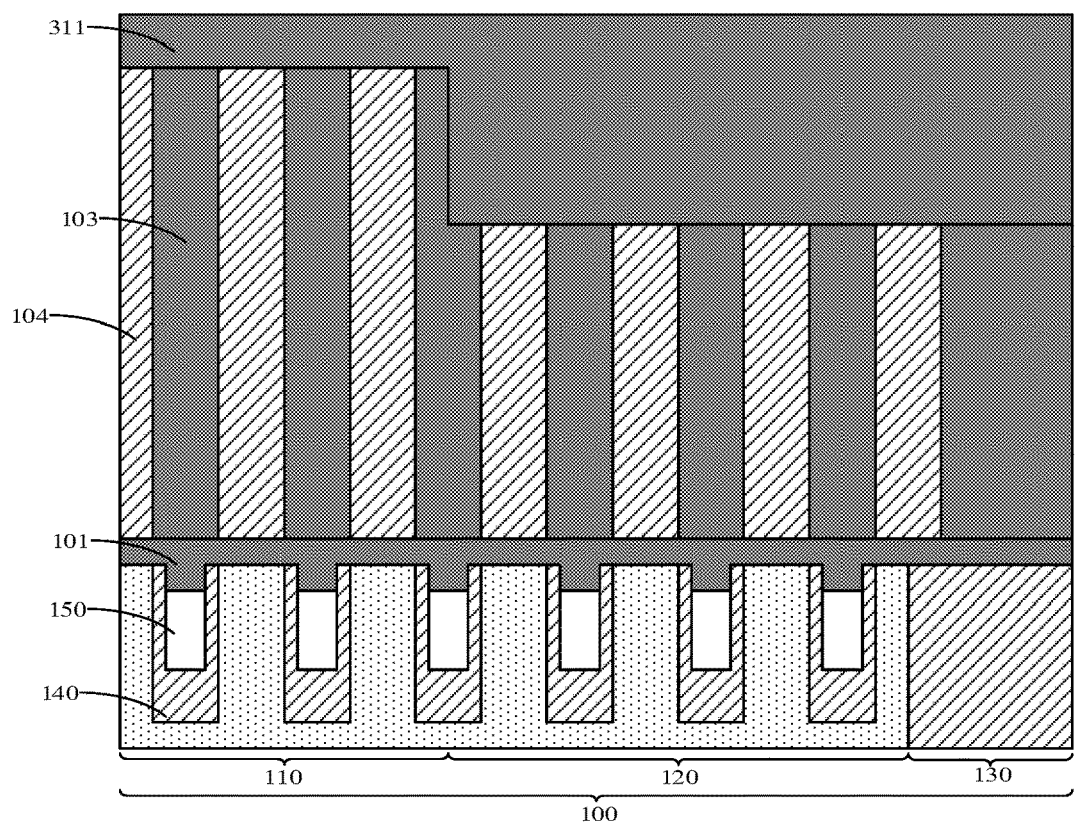

Referring to FIG. 10 to FIG. 12, an insulation film 311 filling the first opening 401 and covering the contact region 110 is formed.

Specifically, the insulation film 311 is formed by atomic layer deposition or chemical vapor deposition. In this embodiment, the insulation film 311 is formed by atomic layer deposition. The insulation film 311 formed by atomic layer deposition has good coverage. In other embodiments, for example, the insulation film 311 may be formed by chemical vapor deposition at 500° C. or 600° C. It is to be noted that, the above examples of specific temperature parameters for chemical vapor deposition are intended only to facilitate the understanding of those skilled in the art, which does not constitute a limitation on the solution. In practical applications, parameters within the above range should all fall within the protection scope of the present application.

The insulation film 311 is made of silicon nitride, silicon dioxide, or silicon oxynitride. In this embodiment, the insulation film 311 is made of silicon nitride.

Figure 13:
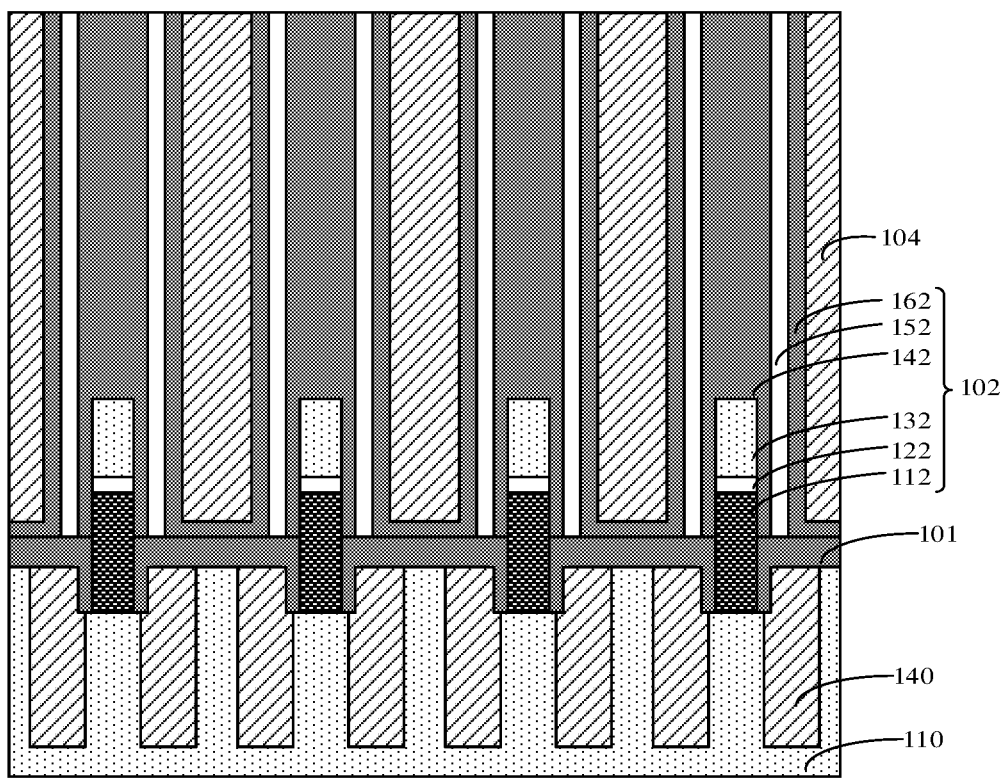
Figure 14:
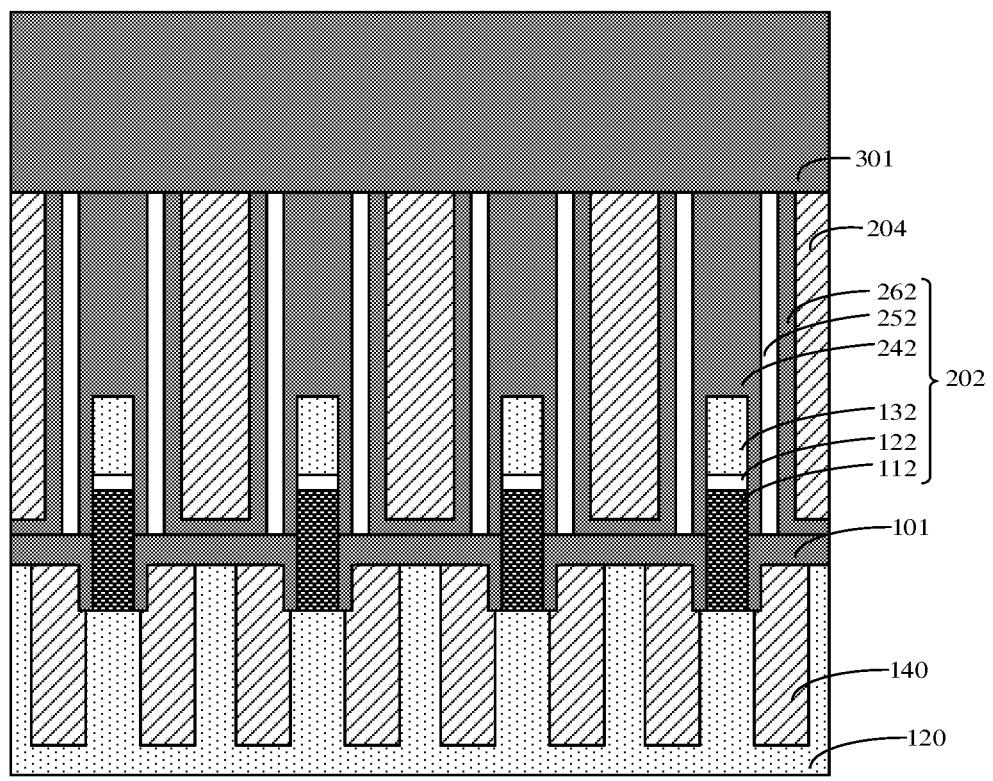
Figure 15:
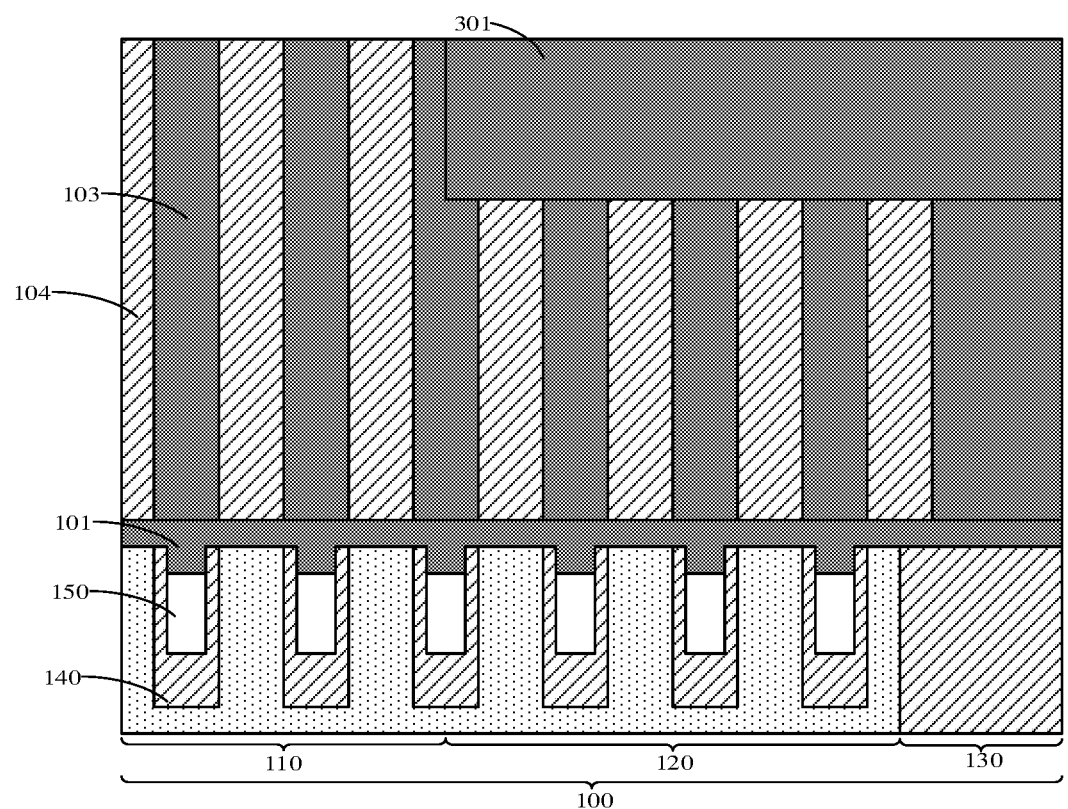

Referring to FIG. 13 to FIG. 15, the insulation film 311 is etched until top surfaces of the first bitline structure 102 and the first dielectric layer 103 are exposed in the contact region 110, so as to form the insulation layer 301.

Specifically, a top of the insulation film 311 is polished by chemical mechanical polishing to form the insulation layer 301 with a relatively-flat top surface. Chemical mechanical polishing has a higher removal rate compared with an etch process, which helps reduce a process cycle.

Figure 16:
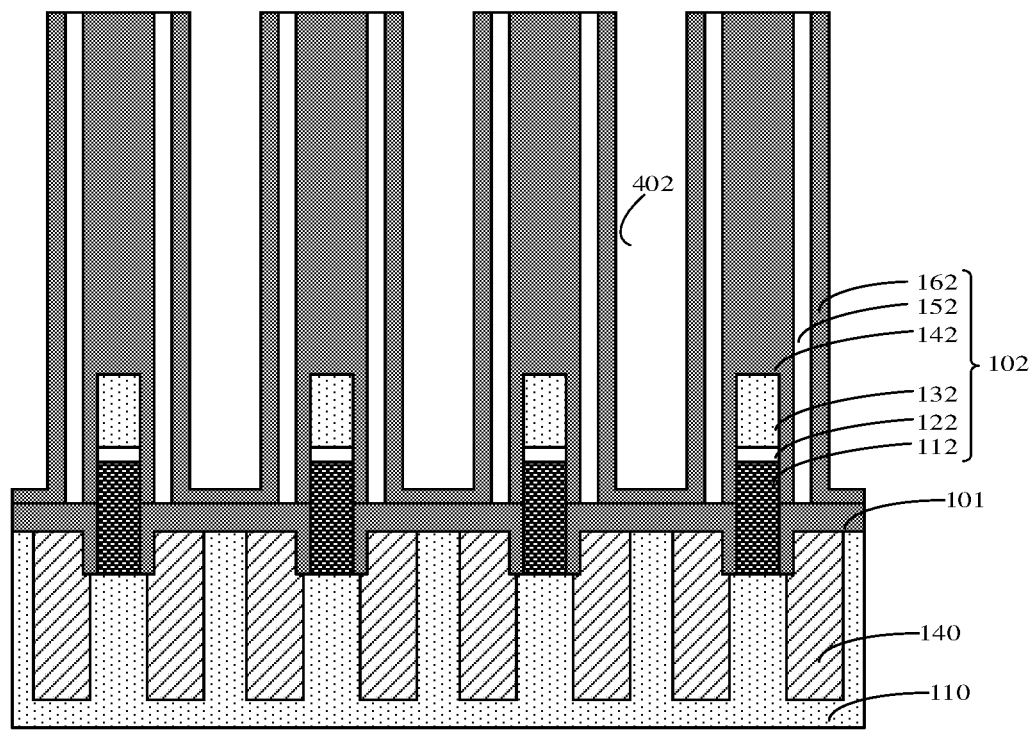
Figure 17:
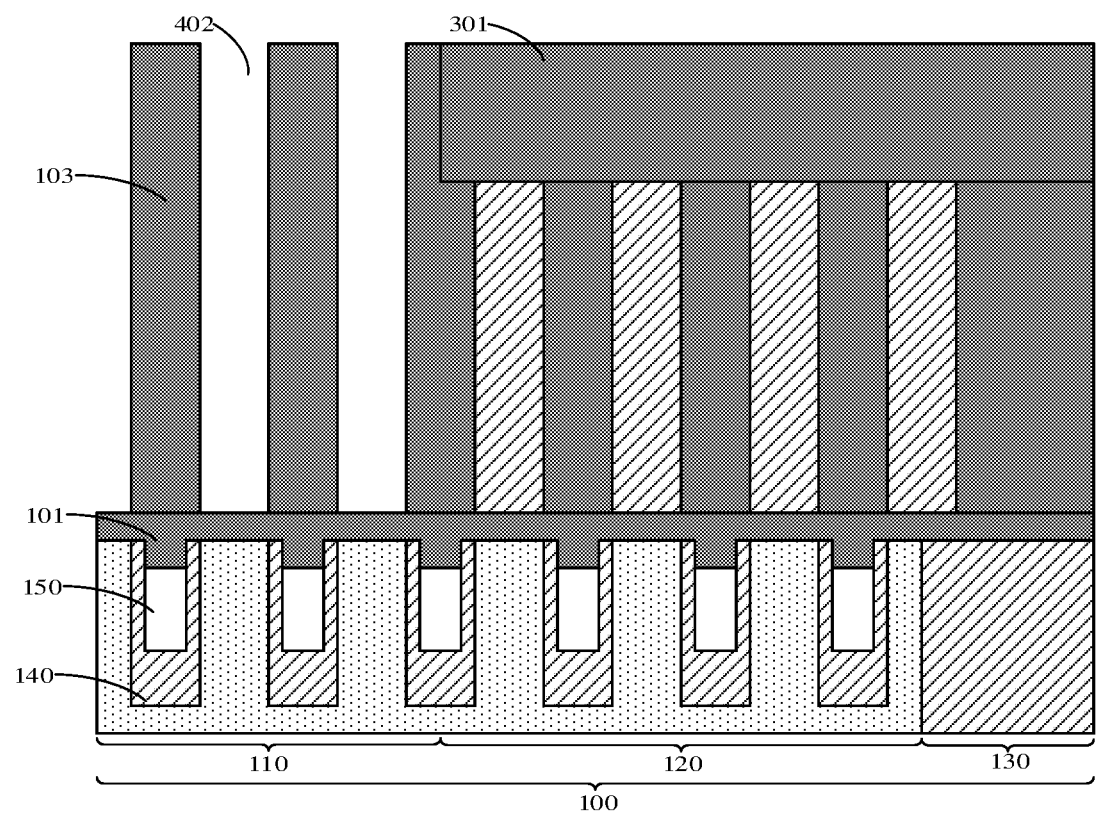

Referring to FIG. 16 and FIG. 17, in the contact region 110, the first sacrificial layer 104 is removed to form a second opening 402.

Specifically, in this embodiment, the first sacrificial layer 104 in the contact region 110 is removed by wet cleaning. According to the wet cleaning, a suitable etch material can be selected to enable the wet cleaning to have a certain etch selectivity ratio for the first sacrificial layer 104 and the first dielectric layer 103, so as to prevent damages to the formed semiconductor structure caused by the etching of the first dielectric layer 103 during the etching of the first sacrificial layer 104.

In addition, in other embodiments, the first sacrificial layer is made of a carbon-containing material, and the sacrificial layer may be removed by ashing in a subsequent process of removing the first sacrificial layer to form a second opening. Ashing gas reacts with the carbon-containing material to produce carbon dioxide gas, so as to convert the first sacrificial layer into gaseous carbon dioxide, thereby removing the first sacrificial layer, which prevents collapse caused by a larger impact formed on the first dielectric layer on the sidewall during the forming of the second opening.

Referring to FIG. 18 to FIG. 25, a capacitor contact structure 400 located in the second opening 402 is formed.

Specifically, the step of forming a capacitor contact structure 400 includes the following steps.

Referring to FIG. 18 to FIG. 23, a bottom conductive layer 302 located in the second opening 402 is formed, a height of a top surface of the bottom conductive layer 302 being less than that of a top surface of the first bitline structure 102.

Specifically, the step of forming a bottom conductive layer 302 includes the following steps.

Figure 18:
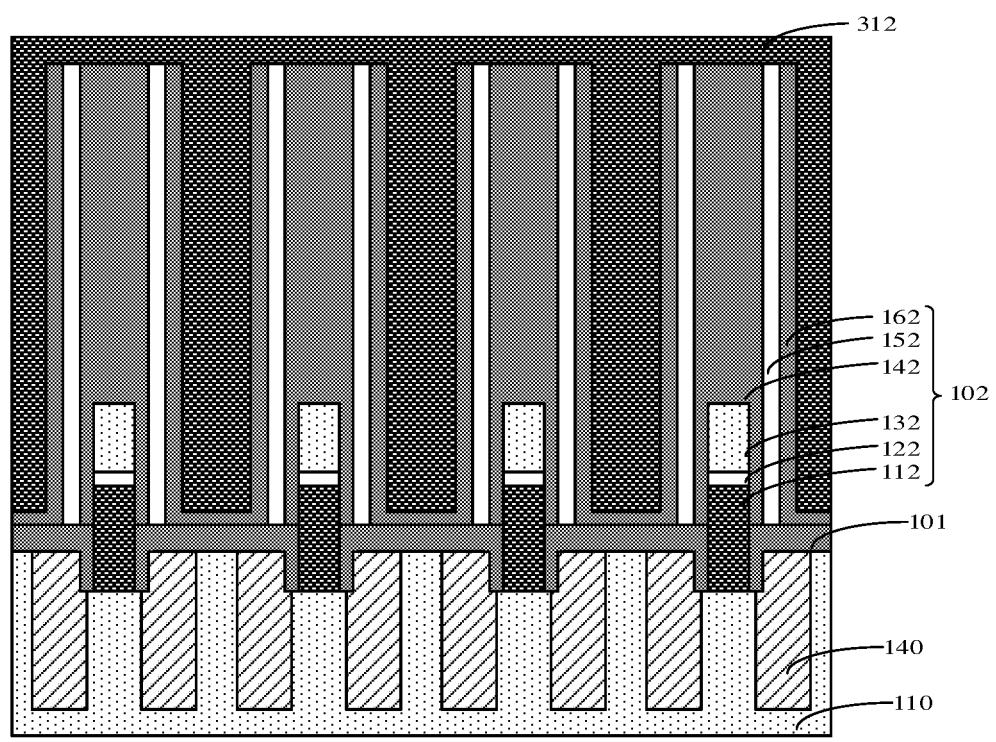
Figure 19:
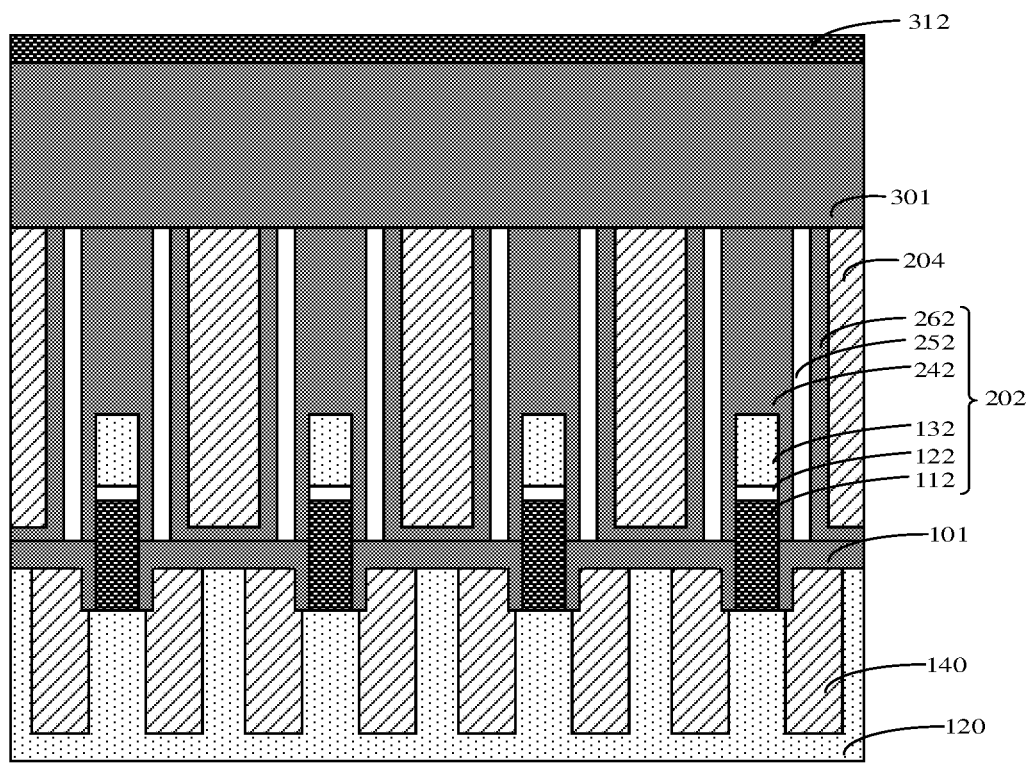
Figure 20:
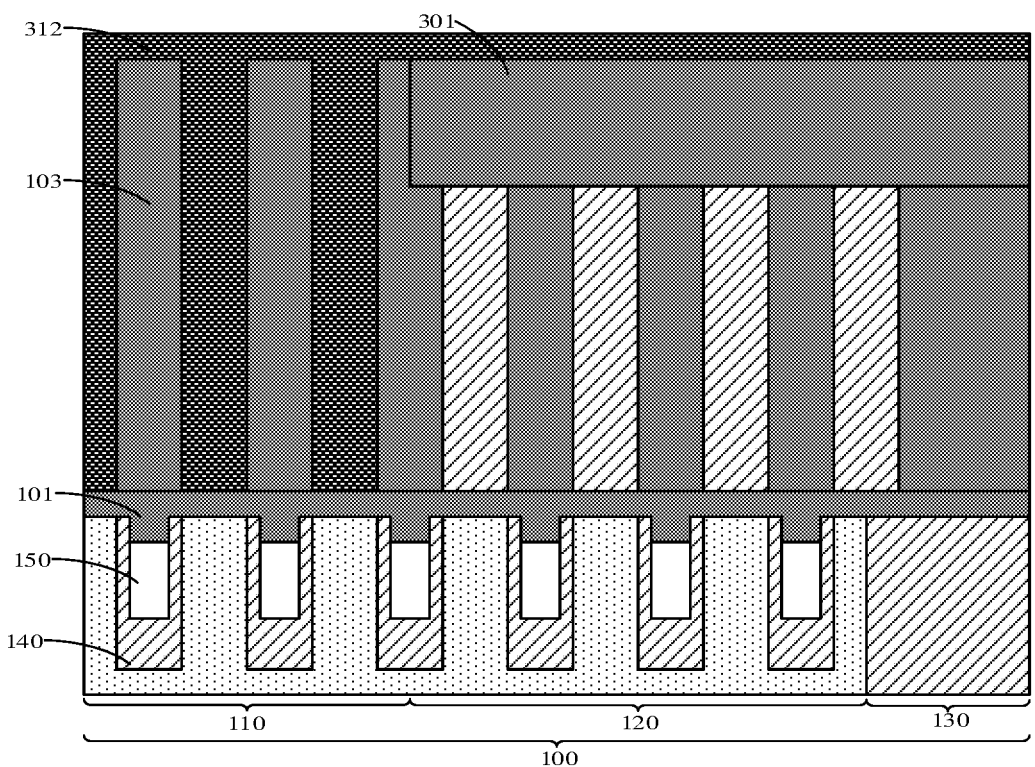

Referring to FIG. 18 to FIG. 20, a first conductive film 312 filling the second opening 402 and covering the dummy region 120 is formed.

In this embodiment, the first conductive film 312 is made of polysilicon formed by Spin-On Deposition (SOD). The first conductive film 312 formed by SOD has better adhesion and gap filling capability, which ensures that the first conductive film 312 formed can completely fill the second opening 402.

The part of the first conductive film 312 which is higher than the top surface of the first bitline structure 102 is removed to form a second conductive film (not shown) configured to fill the second opening 402.

Specifically, a top of the first conductive film 312 is polished by chemical mechanical polishing until the top surface of the first bitline structure 102 is exposed, and the second conductive film (not shown) filling the second opening 402 is formed. Chemical mechanical polishing has a higher removal rate compared with an etch process, which helps reduce a process cycle.

Figure 21:
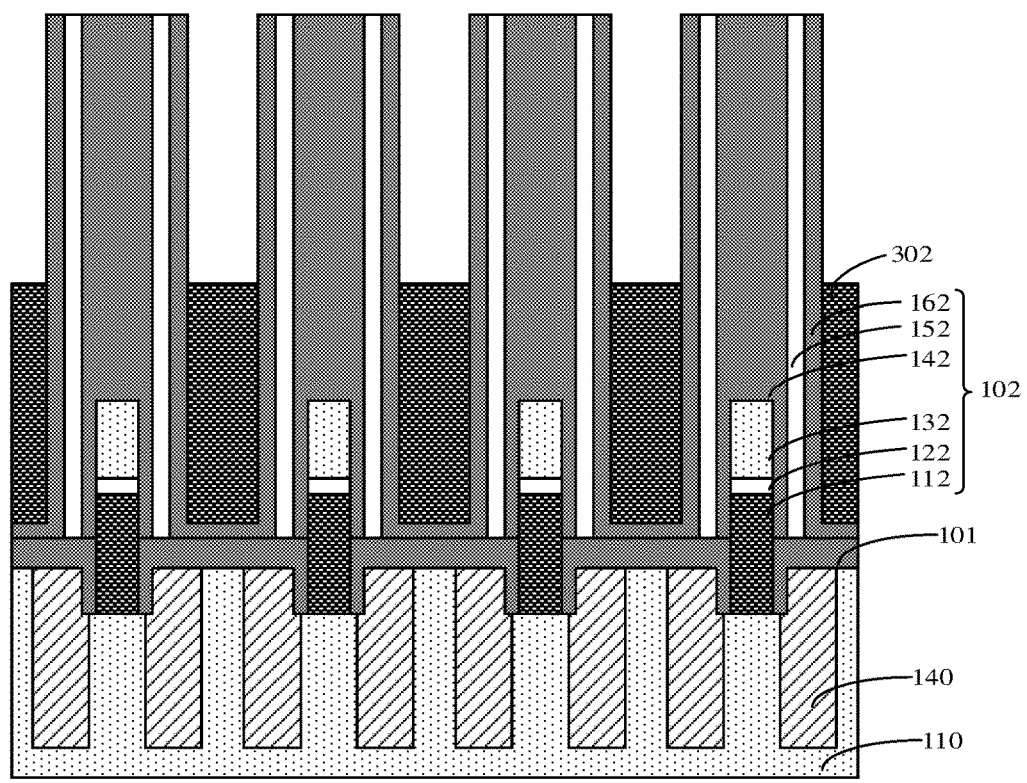
Figure 22:
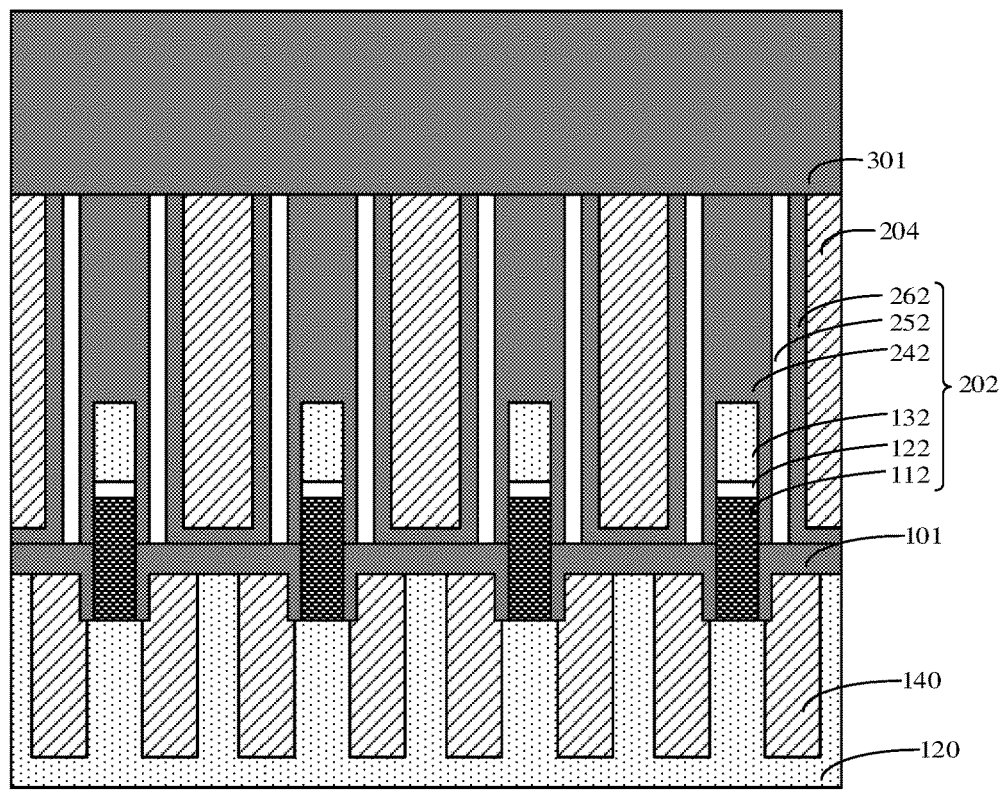
Figure 23:
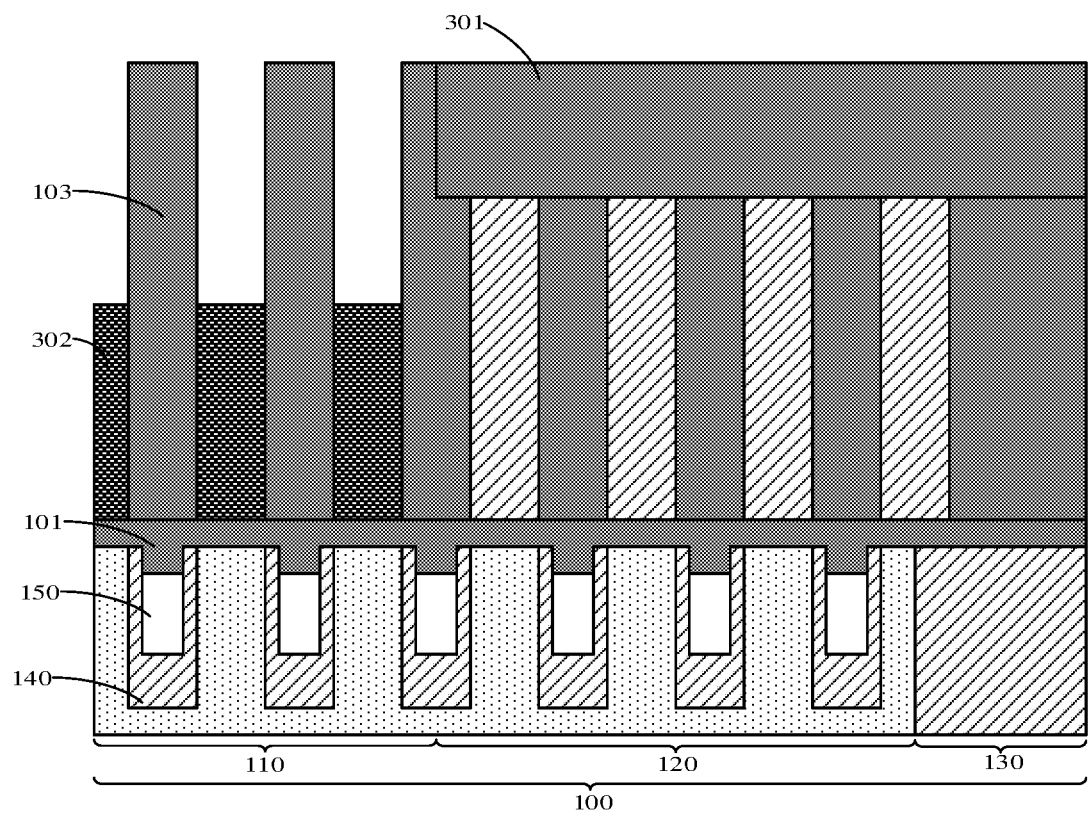

Referring to FIG. 21 to FIG. 23, some thickness of the second conductive film (not shown) is removed, and the remaining second conductive film (not shown) forms the bottom conductive layer 302.

Figure 24:
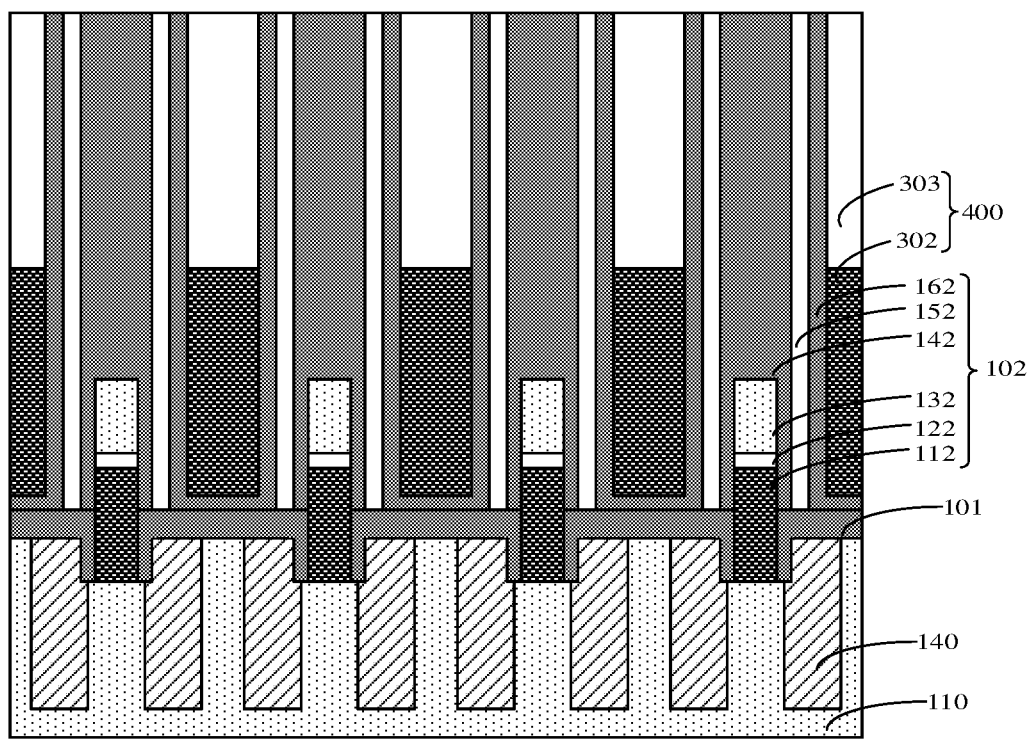
Figure 25:
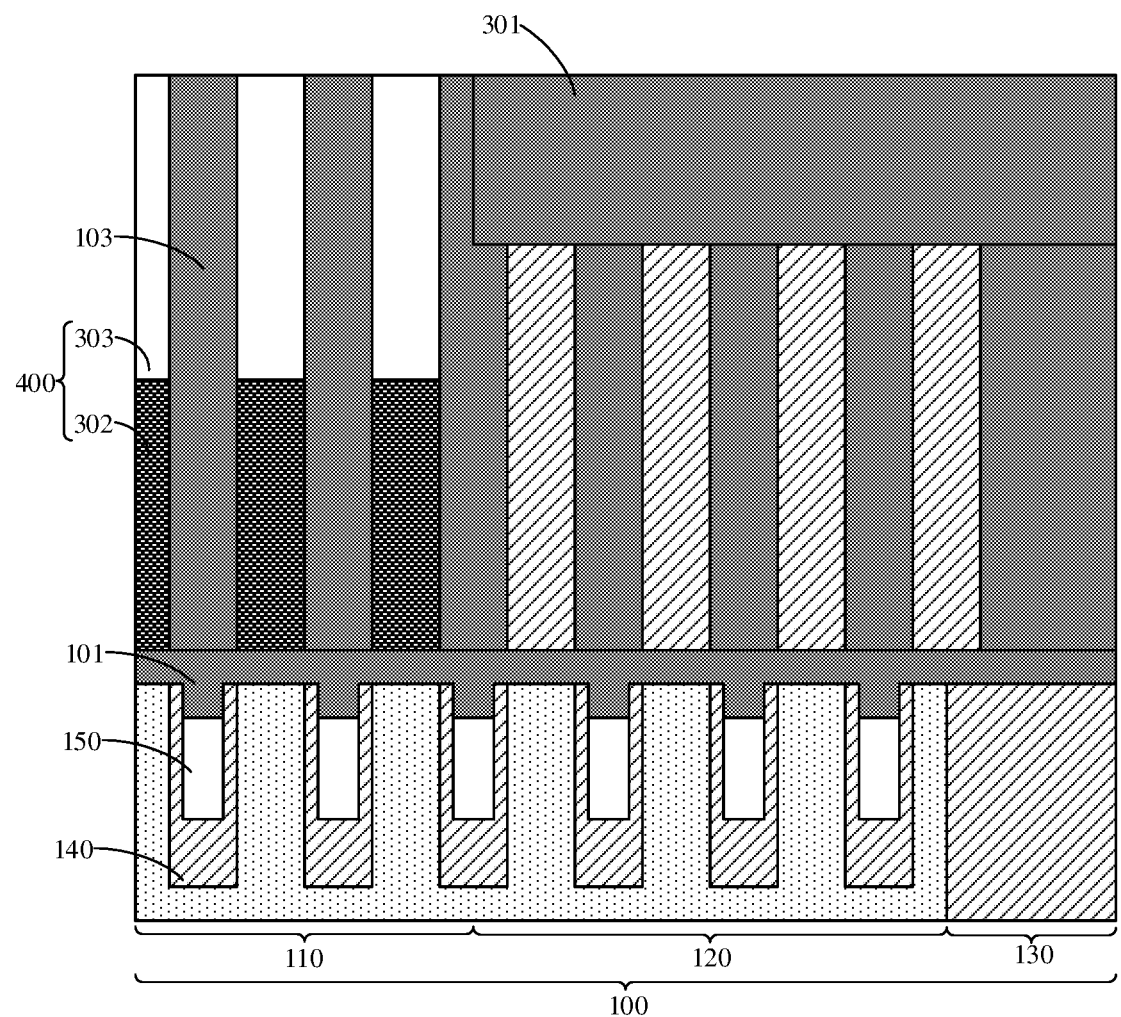

Referring to FIG. 24 and FIG. 25, a top conductive layer 303 filling the second opening is formed. The bottom conductive layer 302 and the top conductive layer 303 formed jointly constitute the capacitor contact structure 400.

In this embodiment, the top conductive layer 303 is made of a conductive material formed by Spin-On Deposition (SOD). The top conductive layer 303 formed by SOD has better adhesion and gap filling capability, which ensures that the top conductive layer 303 formed can completely fill the second opening 402.

The top conductive layer 303 may be made of one or more conductive materials, such as doped polysilicon, titanium, titanium nitride, tungsten and a tungsten compound. In this embodiment, the top conductive layer 303 is made of tungsten and a tungsten compound.

It is to be noted that, in other embodiments, prior to the formation of the top conductive layer, a contact layer may also be formed on a top surface of the bottom conductive layer. The contact material is made of titanium nitride and is configured for an electrical connection between the bottom conductive layer formed by a semiconductor conductive material and the top conductive layer formed by a metal conductive material, so as to reduce resistance of an electrical connection path between the capacitor contact structure and the transistor in the substrate.

Compared with the related art, prior to the manufacturing process of forming the capacitor contact structure, part of height of the dummy capacitor contact structure and part of height of a dummy bitline structure are etched to form the first opening, and an insulation layer filling the first opening is formed, which prevents the problem of short circuit of conductors in a subsequently-formed capacitor contact pad caused by a deep void formed due to damages to part of the dummy capacitor contact structure during the formation of the capacitor contact structure.

Division of the steps above is only for ease of description, and during implementation, the steps may be combined into one step or some steps may be split into multiple steps, all of which shall fall within the protection scope of the patent provided that a same logical relationship is included. Insignificant modifications added to or insignificant designs introduced in a procedure without changing the core of the procedure shall fall within the protection scope of the patent.

A second embodiment of the present application relates to a semiconductor structure.

Referring to FIG. 1, FIG. 24 and FIG. 25, the semiconductor structure according to this embodiment is described in detail below with reference to the accompanying drawings. Contents the same or corresponding to those in the first embodiment are not described in detail below.

A semiconductor structure includes: a substrate 100 including a contact region 110 and a dummy region 120 arranged adjacent to each other; a bitline structure and a dielectric layer, an extension direction of the dielectric layer intersecting with that of the bitline structure, and the bitline structure and the dielectric layer defining discrete capacitor contact openings, wherein the bitline structure includes a first bitline structure 102 and a second bitline structure 202, the dielectric layer includes a first dielectric layer 103 and a second dielectric layer 203, the second bitline structure 202 and the second dielectric layer 203 are located in the dummy region 120, the first bitline structure 102 and the first dielectric layer 103 are located in the contact region 110, a height of the second bitline structure 202 is less than that of the first bitline structure 102, and a height of the second dielectric layer 203 is less than that of the first dielectric layer 103; a second sacrificial layer 204 filling the capacitor contact opening in the dummy region 120; an insulation layer 301 located on top surfaces of the second bitline structure 202, the second dielectric layer 203 and the second sacrificial layer 204 in the dummy region 120, a top surface of the insulation layer 301 being flush with a top surface of the first bitline structure 102; and a capacitor contact structure 400 filling the capacitor contact opening in the contact region 110.

Specifically, the substrate 100 includes a shallow trench isolation structure 140 and a wordline structure 150. The shallow trench isolation structure 140 is configured to isolate adjacent active regions (not shown). The wordline structure 150 is of a buried structure, is formed inside the substrate 100, forms as a gate of a transistor, and is configured to connect the first bitline structure 102. It is to be noted the substrate 100 further includes other semiconductor structures in addition to the shallow trench isolation structure 140 and the wordline structure 150. Since the other semiconductor structures do not involve the core technology of the present application, they are not described in detail herein. Those skilled in the art may understand that the substrate 100 further includes other semiconductor structures in addition to the shallow trench isolation structure 140 and the wordline structure 150, for the normal operation of the semiconductor structure.

The first bitline structure 102 includes a bitline contact layer 112, a conductive contact layer 122, a metal layer 132 and a top dielectric layer 142 sequentially stacked. In this embodiment, the top dielectric layer 142 further covers sidewalls of the bitline contact layer 112, the conductive contact layer 122 and the metal layer 132 and forms as a first isolation layer of the first bitline structure 102. A second isolation layer 152 is further formed on a sidewall of the first isolation layer. A third isolation layer 162 is further formed on a sidewall of the second isolation layer 152. In this embodiment, a structure of a plurality of isolation layers is formed on a sidewall of the first bitline structure 102, so as to reduce parasitic capacitance between the first bitline structure 102 and a capacitor contact structure formed by filling the capacitor contact opening.

In this embodiment, a difference between a height of a bottom surface of the insulation layer 301 and a height of the metal layer 132 in the second bitline structure 202 is 20 nm to 90 nm. Parasitic capacitance between the metal layer of the bitline structure and other conductive structures is reduced by ensuring a distance between metal layer 132 in the second bitline structure 202 and the bottom surface of the insulation layer 301.

In this embodiment, the capacitor contact structure 400 includes: a bottom conductive layer 302 located in the capacitor contact opening in the contact region 110, a height of a top surface of the bottom conductive layer 302 being less than that of the top surface of the first bitline structure 102; and a top conductive layer 303 located on the top surface of the bottom conductive layer 302 and configured to fill the capacitor contact opening in the contact region 110.

It is to be noted that, in other embodiments, prior to the formation of the top conductive layer, a contact layer may also be formed on a top surface of the bottom conductive layer. The contact material is made of titanium nitride and is configured for an electrical connection between the bottom conductive layer formed by a semiconductor conductive material and the top conductive layer formed by a metal conductive material, so as to reduce resistance of an electrical connection path between the capacitor contact structure and the transistor in the substrate.

Compared with the related art, the insulation layer located at top of the second bitline structure and the second dielectric layer, that is, the insulation layer located at a top of the dummy capacitor contact structure defined by the dummy bitline structure and the dielectric layer, prevents the problem of short circuit of conductors in a subsequently-formed capacitor contact pad caused by a deep void formed due to damages to part of the dummy capacitor contact structure during the formation of the capacitor contact structure.

Since the first embodiment is corresponding to this embodiment, this embodiment can collaborate with the first embodiment for implementation. Related technical details described in the first embodiment are still valid in this embodiment, and technical effects that can be achieved in the first embodiment may also be achieved in this embodiment, and are not described herein to avoid repetition. Correspondingly, related technical details described in this embodiment may also be applied to the first embodiment.

Those of ordinary skill in the art may understand that the above embodiments are specific embodiments for implementing the present application. However, in practical applications, various changes in forms and details may be made thereto without departing from the spirit and scope of the present application.

What is claimed is:

1. A semiconductor structure formation method, comprising:

providing a substrate, the substrate comprising a contact region and a dummy region arranged adjacent to each other, a first bitline structure and a first dielectric layer arranged discretely and being formed on the substrate, an extension direction of the first dielectric layer intersecting with that of the first bitline structure, and the first bitline structure and the first dielectric layer defining discrete capacitor contact openings;

forming a first sacrificial layer filling the capacitor contact openings;

removing, in the dummy region, part of height of the first bitline structure, part of height of the first dielectric layer and part of height of the first sacrificial layer to form a first opening located at top of a second bitline structure, a second dielectric layer and a second sacrificial layer, wherein a remaining portion of the first bitline structure forms the second bitline structure, a remaining portion of the first dielectric layer forms the second dielectric layer, and a remaining portion of the first sacrificial layer forms the second sacrificial layer;

forming an insulation layer filling the first opening;

removing, in the contact region, the first sacrificial layer to form a second opening; and forming a capacitor contact structure located in the second opening.

2. The semiconductor structure formation method according to claim 1, wherein the step of forming a first sacrificial layer filling the capacitor contact openings comprises:

forming a first sacrificial film filling the capacitor contact openings and covering the first bitline structure and the first dielectric layer; and removing a part of the first sacrificial film which is higher than a top surface of the first bitline structure to form the first sacrificial layer.

3. The semiconductor structure formation method according to claim 1, wherein the step of removing, in the dummy region, part of height of the first bitline structure, part of height of the first dielectric layer and part of height of the first sacrificial layer to form a first opening located at top of a second bitline structure, a second dielectric layer and a second sacrificial layer comprises:

forming, in the contact region, a mask layer located on top surfaces of the first bitline structure, the first dielectric layer and the first sacrificial layer; and etching, based on the mask layer, the part of the height of the first bitline structure, the part of height of the first dielectric layer and the part of the height of the first sacrificial layer in the dummy region to form the second bitline structure, the second dielectric layer, the second sacrificial layer and the first opening.

4. The semiconductor structure formation method according to claim 3, wherein the step of forming, in the contact region, a mask layer located on top surfaces of the first bitline structure, the first dielectric layer and the first sacrificial layer comprises:

forming a mask located on the top surfaces of the first bitline structure, the first dielectric layer and the first sacrificial layer;

forming a photoresist on a top surface of the mask in the contact region; and patterning the mask based on the photoresist to form the mask layer.

5. The semiconductor structure formation method according to claim 1, wherein in a direction perpendicular to the substrate, a distance between a metal layer located in the second bitline structure and a bottom surface of the first opening is 20 nm to 90 nm.

6. The semiconductor structure formation method according to claim 1, wherein the step of forming an insulation layer filling the first opening comprises:

forming an insulation film filling the first opening and covering the contact region; and etching the insulation film until top surfaces of the first bitline structure and the first dielectric layer are exposed in the contact region, so as to form the insulation layer.

7. The semiconductor structure formation method according to claim 1, wherein the first sacrificial layer in the contact region is removed by wet cleaning.

8. The semiconductor structure formation method according to claim 1, wherein the step of forming a capacitor contact structure located in the second opening comprises:

forming a bottom conductive layer located in the second opening, a height of a top surface of the bottom conductive layer being less than that of a top surface of the first bitline structure; and forming a top conductive layer filling the second opening.

9. The semiconductor structure formation method according to claim 8, wherein the step of forming a bottom conductive layer located in the second opening comprises:

forming a first conductive film filling the second opening and covering the dummy region;

removing a part of the first conductive film which is higher than the top surface of the first bitline structure to form a second conductive film configured to fill the second opening; and removing some thickness of the second conductive film, a remaining portion of the second conductive film forming the bottom conductive layer.

10. A semiconductor structure, comprising:

a substrate comprising a contact region and a dummy region arranged adjacent to each other;

a bitline structure and a dielectric layer, an extension direction of the dielectric layer intersecting with that of the bitline structure, and the bitline structure and the dielectric layer defining discrete capacitor contact openings, wherein the bitline structure comprises a first bitline structure and a second bitline structure, the dielectric layer comprises a first dielectric layer and a second dielectric layer, the second bitline structure and the second dielectric layer are located in the dummy region, the first bitline structure and the first dielectric layer are located in the contact region, a height of the second bitline structure is less than that of the first bitline structure, and a height of the second dielectric layer is less than that of the first dielectric layer;

a second sacrificial layer filling the capacitor contact openings in the dummy region;

an insulation layer located on top surfaces of the second bitline structure, the second dielectric layer and the second sacrificial layer in the dummy region, a top surface of the insulation layer being flush with a top surface of the first bitline structure; and a capacitor contact structure filling the capacitor contact openings in the contact region.

11. The semiconductor structure according to claim 10, wherein the capacitor contact structure comprises:

a bottom conductive layer located in the capacitor contact openings in the contact region, a height of a top surface of the bottom conductive layer being less than that of the top surface of the first bitline structure; and a top conductive layer located on the top surface of the bottom conductive layer and configured to fill the capacitor contact openings in the contact region.

12. The semiconductor structure according to claim 11, wherein a contact layer is formed on the top surface of the bottom conductive layer.

13. The semiconductor structure according to claim 12, wherein the contact layer is made of titanium nitride.

14. The semiconductor structure according to claim 10, wherein a difference between a height of a bottom surface of the insulation layer and a height of a metal layer in the second bitline structure is 20 nm to 90 nm.

15. The semiconductor structure according to claim 10, wherein the first bitline structure comprises a bitline contact layer, a conductive contact layer, a metal layer and a top dielectric layer which are sequentially stacked.

16. The semiconductor structure according to claim 15, wherein the top dielectric layer covers sidewalls of the bitline contact layer, the conductive contact layer and the metal layer; and the top dielectric layer forms as a first isolation layer of the first bitline structure.

17. The semiconductor structure according to claim 16, wherein a second isolation layer is formed on a sidewall of the first isolation layer, and a third isolation layer is formed on a sidewall of the second isolation layer.

* * * * *